United States Patent [19]

Larson

[11] Patent Number: 5,146,117
[45] Date of Patent: Sep. 8, 1992

[54] CONVERTIBLE MULTI-FUNCTION MICROELECTRONIC LOGIC GATE STRUCTURE AND METHOD OF FABRICATING THE SAME

[75] Inventor: Lawrence E. Larson, Santa Monica, Calif.

[73] Assignee: Hughes Aircraft Company, Los Angeles, Calif.

[21] Appl. No.: 678,489

[22] Filed: Apr. 1, 1991

[51] Int. Cl.⁵ .......................................... H03K 19/094
[52] U.S. Cl. .................................... 307/465; 307/362; 307/468
[58] Field of Search ................ 307/443, 465, 468–469, 307/362; 357/23.7

[56] References Cited

U.S. PATENT DOCUMENTS

| | | | |
|---|---|---|---|
| 4,084,105 | 4/1978 | Teranishi et al. | 307/468 X |
| 4,482,822 | 11/1984 | Kamuro et al. | 307/468 |
| 4,583,011 | 4/1986 | Pechar | 307/468 X |
| 4,766,516 | 8/1988 | Ozdenir et al. | 357/40 X |

Primary Examiner—David Hudspeth
Attorney, Agent, or Firm—E. E. Leitereg; W. K. Denson-Low

[57] ABSTRACT

A plurality of field effect transistors (FETS) ($Q_0A$ to $Q_{n-1}A$, and $Q_0B$ to $Q_{n-1}B$) are arranged in a structure (10) to normally perform a first logic function such as NAND. Selectively implanting the channel region (38) of at least one of the FETs (30) with sufficient ions of a predetermined ion species such that the respective FET (30) maintains a constant logic state (constantly turned ON or OFF) for all logical values of applied gate voltage converts the structure (10) to perform a second logic function such as NOR. Alternatively, one of the logic states may be "stuck high" (constant logical high output) or "stuck low" (constant logical low output). The channel implants are substantially undetectable, rendering the structure (10) highly resistant to reverse engineering.

17 Claims, 2 Drawing Sheets

CONVERTIBLE MULTI-FUNCTION MICROELECTRONIC LOGIC GATE STRUCTURE AND METHOD OF FABRICATING THE SAME

BACKGROUND OF THE INVENTION

1. Field of the Invention

The present invention relates to a microelectronic logic gate structure which is convertible in a substantially undetectable manner to perform a selected one of two or more logic functions.

2. Description of the Related Art

Intense industrial competition and security in the production of microelectronic components has created a demand for "secure" logic circuits which are difficult to "reverse engineer". Reverse engineering refers to the analysis of a microelectronic circuit integrated device to determine the detailed structure thereof, such so that the device can be copied or otherwise compromised.

A method for protecting hardware integrated circuits or microcircuits against unauthorized copying and/or use is described in U.S. Pat. No. 4,766,516, entitled "Method and Apparatus for Securing Integrated Circuits from Unauthorized Copying and Use", issued Aug. 22, 1988, to F. Ozdemir et al, and assigned to Hughes Aircraft Company, the assignee of the present invention. According to the disclosed technique, at least one additional circuit element that does not contribute toward the function of an integrated circuit (IC), but rather inhibits the proper functioning of the IC in case of an attempted copying, analysis, or other unauthorized use, is fabricated along with the overall IC. The identities of the additional circuit elements are disguised by forming them with the visible appearance of apparent elements, but with physical modifications that are not readily visible to a copyist but cause them to function in a different manner. Such modifications include very narrow open circuit cuts in metallized connection lines, preferably made with a focused ion beam (FIB) or laser beam; disordering the lattice structure or changing the doping level of a semiconductor region, preferably with a FIB; and injecting electrical charge into a semiconductor region, preferably with an electron beam.

The FIB and other types of modifications are relatively undetectable, which is desirable for the intended purpose of deterring unauthorized copying and/or use. However, the additional circuit elements take up valuable space on the microcircuit chips, and do not serve any purpose other than rendering the functional elements operative or inoperative. In addition, processing the additional circuit elements to render the IC operative involves expensive and relatively slow FIB or laser cutting operations, making the method feasible only in applications where large quantity production and/or low fabrication cost are not required.

SUMMARY OF THE INVENTION

The present invention provides a microelectronic logic gate structure which is convertible to perform a selected one of two or more logic functions. A plurality of field effect transistors (FETS) are arranged to normally perform a first logic function such as NAND. Selectively implanting the channel region of at least one of the FETs with sufficient ions of a predetermined ion species such that the respective FET maintains a constant logic state (constantly turned ON or OFF) for all logical values of applied gate voltage converts the structure to perform a second logic function such as NOR. Alternatively, one of the logic states may be "stuck high" (constant logical high output) or "stuck low" (constant logical low output).

The channel implants change the doping level in the FET channel region such that the threshold voltage of the FET is permanently altered. The implants can be performed for n-channel metal oxide semiconductor (NMOS), p-channel metal oxide semiconductor (PMOS), and complementary metal oxide semiconductor (CMOS) logic using a single masking and implantation step which is fast and inexpensive compared to FIB processing and laser cutting. In the case of CMOS, an implant which decreases the threshold voltage of an n-channel FET and causes it to be constantly turned ON will decrease the threshold voltage of a p-channel FET and cause it to be constantly turned OFF. The invention may also be practiced using metal semiconductor (MESFET) FETs in a direct coupled FET logic (DCFL) configuration on a gallium arsenide substrate.

The channel implants are substantially undetectable, rendering the structure highly resistant to reverse engineering. The logic function performed by the gate structure is solely dependent on the threshold voltage of the individual FETs, and not on changes in their interconnection. As a result, it is almost impossible using current reverse engineering technology to determine the design of the logic structure based on the knowledge of the FET interconnections. Where each logic gate has a total of four possible functions, a logic circuit containing n gates could, in principle, have $4^n$ different configurations, making reverse engineering through permutational analysis of the structure prohibitively difficult.

The present gate structure does not need to include any circuit elements other than those which constitute the gates themselves, and provides a useful logic function in its unaltered or unconverted form. The logic function can be converted from, for example, NAND to NOR, by changing the threshold voltage of a single FET through ion implantation.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
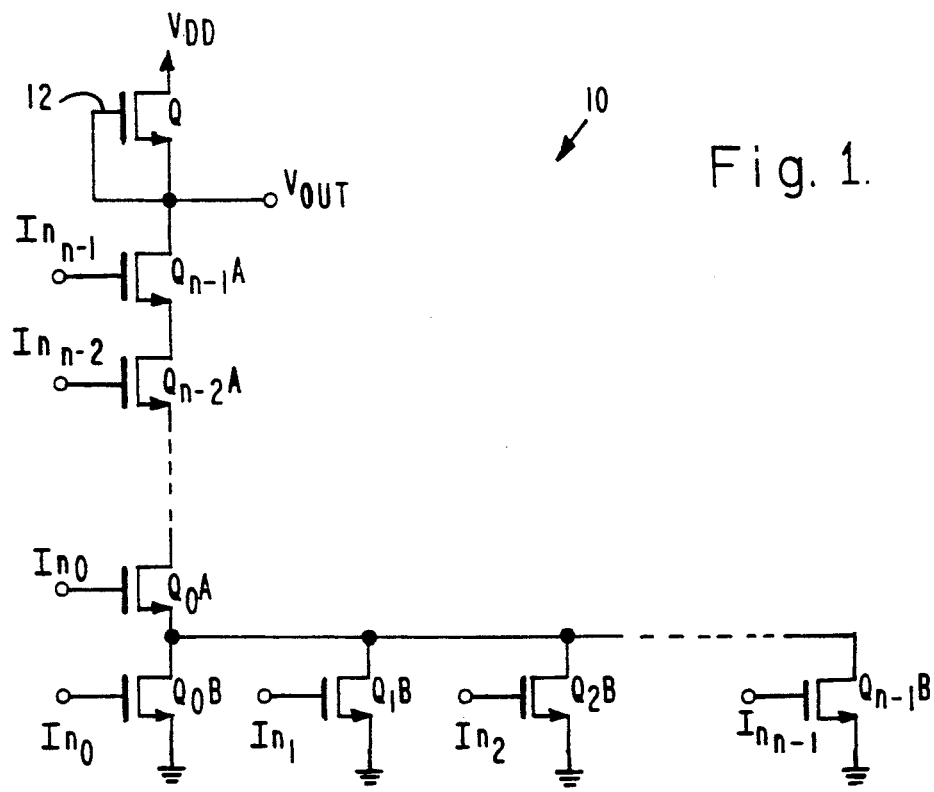
FIG. 1 is an diagram of a convertible logic gate structure embodying the present invention in an NMOS configuration.

Referring to FIG. of the drawing, a convertible logic gate structure 10 embodying the present invention is illustrated in an NMOS configuration. The structure 10 includes any desired number n of inputs designated as $In_0$ to $In_{n-1}$ which are applied to the gates of enhancement mode, n-channel FETs $Q_0B$ to $Q_{n-1}B$ respectively. The FETs $Q_0B$ to $Q_{n-1}B$ are connected in parallel circuit with each other, having their sources connected to ground and their drains connected together. The inputs $In_0$ to $In_{n-1}$ are also connected to the gates of enhancement mode, n-channel FETs $Q_0A$ to $Q_{n-1}A$ respectively. The FETs $Q_0A$ to $Q_{n-1}A$ are connected in series circuit with each other, and also in series circuit with the parallel combination of the FETs $Q_0B$ to $Q_{n-1}B$. More specifically, the source of the FET $Q_0A$ is connected to the drains of the FETs $Q_0B$ to $Q_{n-1}B$. The drain of the FET $Q_{n-1}A$ is connected through a constant current source 12 to a positive direct current power source $V_{DD}$. The output $V_{OUT}$ of the logic gate structure 10 is taken at the junction of the FET $Q_{n-1}A$ and the constant current source 12.

The structure 10 normally functions logically as a NAND gate, producing a logically low output if all of the inputs $In_0$ to $In_{n-1}$ are logically high, and a logically high output if any of the inputs $In_0$ to $In_{n-1}$ are logically low. The FETs $Q_0A$ to $Q_{n-1}A$ perform the NAND function. If the inputs to all of the FETs $Q_0A$ to $Q_{n-1}A$ are logically high, all of the FETs $Q_0A$ to $Q_{n-1}A$ will be turned ON and provide a series connection between the output $V_{OUT}$ and ground. If the input to any of the FETs $Q_0A$ to $Q_{n-1}A$ is logically low, the respective FET will be turned OFF, and the series connection between the output $V_{OUT}$ and ground will be broken. The output $V_{OUT}$ in this case will be pulled logically high by the constant current source 12.

The unaltered or unconverted structure 10 will function as a NAND gate irrespective of the presence of the FETs $Q_0B$ to $Q_{n-1}B$. If all of the inputs $In_0$ to $In_{n-1}$ are logically high, the FETs $Q_0B$ to $Q_{n-1}B$ will be turned ON and provide a parallel path to ground. If any of the inputs $In_0$ to $In_{n-1}$ is low, the respective FETs $Q_0B$ to $Q_{n-1}B$ will be turned off. However, this does not affect the logical state of the structure 10, since the respective FETs $Q_0A$ to $Q_{n-1}A$ will also be turned off and open the series path from the output $V_{OUT}$ to ground. It will be noted that the structure 10 will also function as a NAND gate if any or all of the FETs $Q_1B$ to $Q_{n-1}B$ are modified through ion implantation such that they are always turned OFF.

The structure 10 may be modified through selective implantation of ions into the channel regions of the FETs $Q_0A$ to $Q_{n-1}A$ or $Q_0B$ to $Q_{n-1}B$ to permanently alter the threshold voltages thereof. Implantation of sufficient ions of a donor ion species such as arsenic or phosphorous will increase the donor doping level and decrease the threshold voltages of the respective FETs $Q_0A$ to $Q_{n-1}A$ or $Q_0B$ to $Q_{n-1}B$ such that they will be constantly turned ON for all logical levels of applied gate voltage. Conversely, implantation of sufficient ions of an acceptor ion species such as boron or aluminum will increase the acceptor doping level and increase the threshold voltages of the respective FETs $Q_0A$ to $Q_{n-1}A$ or $Q_0B$ to $Q_{n-1}B$ such that they will be constantly turned OFF for all logical levels of applied gate voltage.

The structure 10 may be converted to perform a logical NOR function by implanting all of the FETs $Q_0A$ to $Q_{n-1}A$ with sufficient ions of a donor ion species such that they will be constantly turned ON. This provides a permanent series connection through the FETs $Q_0A$ to $Q_{n-1}A$ between the drains of the FETs $Q_0B$ to $Q_{n-1}B$ and the output $V_{OUT}$. The FETs $Q_0B$ to $Q_{n-1}B$ perform the logical NOR function. If all of the inputs $In_0$ to $In_{n-1}$ are logically low, all of the FETs $Q_0B$ to $Q_{n-1}B$ will be turned OFF and the output $V_{OUT}$ will be disconnected from ground and pulled logically high by the constant current source 12. If any of the inputs $In_0$ to $In_{n-1}$ is logically high, the respective FETs $Q_0B$ to $Q_{n-1}B$ will be turned on and connect the output $V_{OUT}$ to ground therethrough, producing a logically low output.

The structure 10 may also be converted through selective ion implantation to produce a logical output which is constant for all combinations of applied inputs $In_0$ to $In_{n-1}$. The constant logic state may be high (stuck high) or low (stuck low).

The structure 10 may be converted to produce a "stuck high" output by implanting any of the FETs $Q_0A$ to $Q_{n-1}A$ such that they will be constantly turned OFF. The output $V_{OUT}$ will thereby be disconnected from ground and pulled logically high by the constant current source 12 for all combinations of applied logical inputs $In_0$ to $In_{n-1}$.

The structure may be converted to produce a "stuck low" output by implanting all of the FETs $Q_0A$ to $Q_{n-1}A$ and any or all of the FETs $Q_0B$ to $Q_{n-1}B$ such that they will be constantly turned ON. This provides a permanent connection between the output $V_{OUT}$ and ground through the series connection of the FETs $Q_0A$ to $Q_{n-1}A$, and the parallel connection of the implanted FETs $Q_0B$ to $Q_{n-1}B$, and a constant logically low output for all combinations of applied logical inputs $In_0$ to $In_{n-1}$.

The structure 10 may be embodied using PMOS FETs with the relative polarities and doping levels reversed, or using MESFETs in a DCFL configuration, in arrangements essentially similar to those illustrated using the NMOS FETs.

Figure 2:
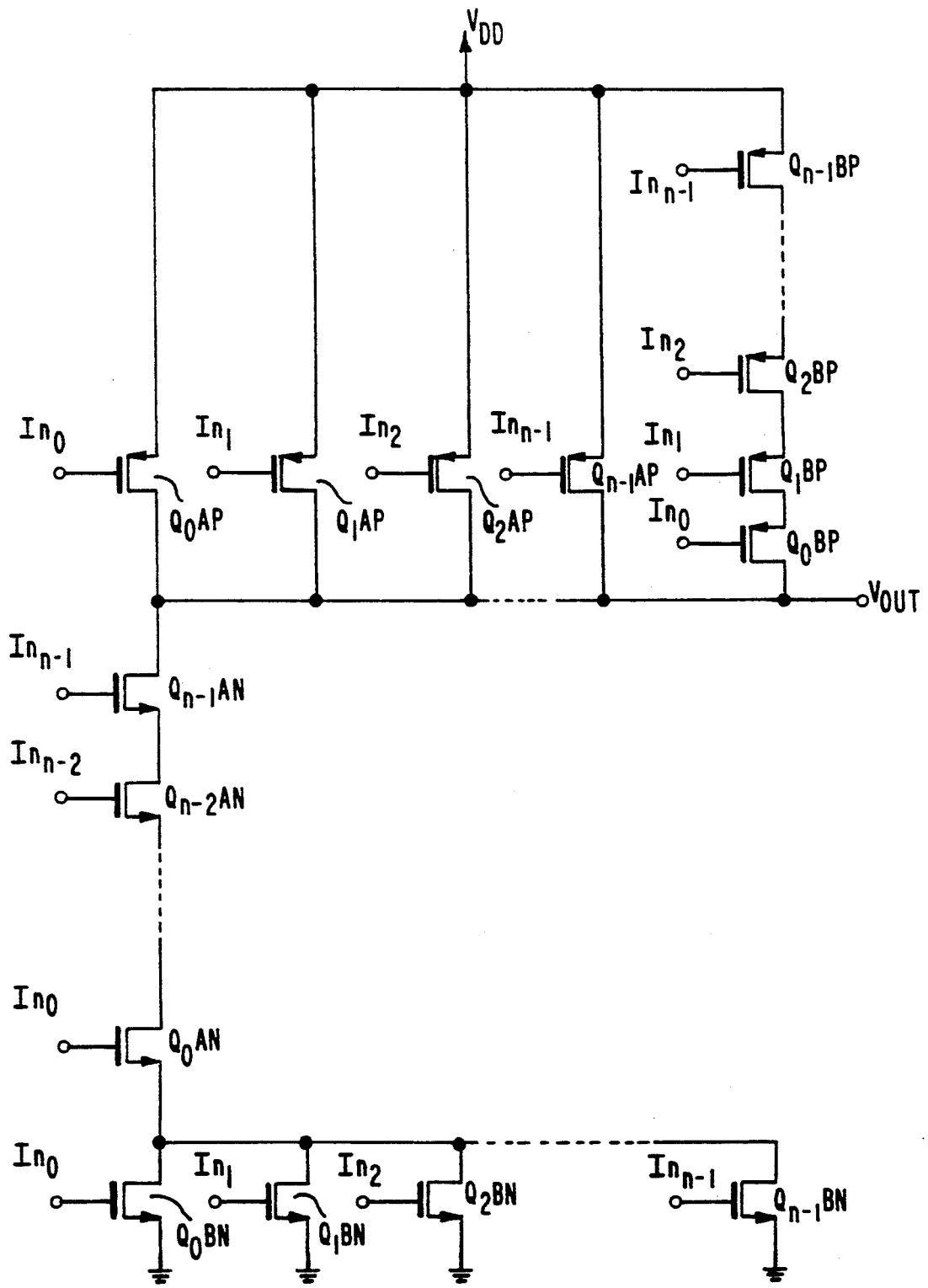
FIG. 2 is an electrical schematic diagram of a convertible logic gate structure embodying the present invention in a CMOS configuration.

FIG. 2 illustrates a convertible logic gate structure 20 embodying the present invention utilizing CMOS FETs. The structure 20 is advantageous over the structure 10 in that the static power dissipation is extremely low. The structure 20 includes enhancement mode, n-channel FETs $Q_0BN$ to $Q_{n-1}BN$ which correspond to the FETs $Q_0B$ to $Q_{n-1}B$ in the structure 10, and enhancement mode, n-channel FETs $Q_0AN$ to $Q_{n-1}AN$ which correspond to the FETs $Q_0A$ to $Q_{n-1}A$ of the structure 10.

In order to provide the low static power dissipation of the CMOS configuration, the inputs $In_0$ to $In_{n-1}$ are further applied to the gates of enhancement mode, p-channel FETs $Q_0AP$ to $Q_{n-1}AP$ which are connected in parallel circuit with each other between the drain of the FET $Q_{n-1}AN$ and the power source $V_{DD}$, and enhancement mode, p-channel FETs $Q_0BP$ to $Q_{n-1}BP$ which are connected in series circuit with each other between the drain of the FET $Q_{n-1}AN$ and the power source $V_{DD}$ respectively.

The p-channel FETs $Q_0AP$ to $Q_{n-1}AP$ are complementary to the n-channel FETs $Q_0AN$ to $Q_{n-1}AN$, whereas the p-channel FETs $Q_0BP$ to $Q_{n-1}BP$ are complementary to the n-channel FETs $Q_0BN$ to $Q_{n-1}BN$ respectively. The operation of the structure 20 is essentially similar to that of the structure 10, except for the provision of the complementary p-channel FETs. The structure 20 will perform a logical NAND function in its unaltered or unconverted state as described above, or with any or all of the FETs $Q_1BN$ to $Q_{n-1}BN$ ion implanted such as to be constantly turned OFF.

When all of the inputs $In_0$ to $In_{n-1}$ are logically high in the unmodified configuration of the structure 20, all of the n-channel FETs $Q_0BN$ to $Q_{n-1}BN$, and $Q_0AN$ to $Q_{n-1}AN$ are turned ON, thereby connecting the output $V_{OUT}$ to ground to produce a logically low output. All of the complementary p-channel FETs $Q_0AP$ to $Q_{n-1}AP$ and $Q_0BP$ to $Q_{n-1}BP$ are turned OFF, thereby disconnecting the output $V_{OUT}$ from the power source $V_{DD}$. This prevents current from flowing from the source $V_{DD}$ to ground through the structure 20.

If any of the inputs $In_0$ to $In_{n-1}$ is logically low, the respective FETs $Q_0AP$ to $Q_{n-1}AP$ and $Q_0BP$ to $Q_{n-1}BP$ will be turned ON, thereby connecting the output $V_{OUT}$ to the source $V_{DD}$ to produce a logically high output. The complementary FETs $Q_0AN$ to $Q_{n-1}AN$ will be turned OFF, thereby disconnecting the output $V_{OUT}$ from ground and preventing current from flowing from the source $V_{DD}$ to ground through the structure 20.

The structure 20 may be converted to perform a NOR function by ion implanting all of the FETs $Q_0AN$ to $Q_{n-1}AN$ such that they will be constantly turned ON, and implanting all of the FETs $Q_0AP$ to $Q_{n-1}AP$ such that they will be constantly turned OFF.

The "stuck high" function may be provided by implanting any of the FETs $Q_0AP$ to $Q_{n-1}AP$ such that they will be constantly turned ON, and any of the FETs $Q_0BN$ to $Q_{n-1}BN$ such that they will be constantly turned OFF. The "stuck low" function may be provided by implanting all of the FETs $Q_0AP$ to $Q_{n-1}AP$ and any of the FETs $Q_0BP$ to $Q_{n-1}BP$ such that they are constantly turned OFF, and implanting all of the FETs $Q_0AN$ to $Q_{n-1}AN$ and any of the FETs $Q_0BN$ and $Q_1BN$ to $Q_{n-1}BN$ such that they are constantly turned ON.

Although the present invention has been described and illustrated as being embodied by NAND and NOR logic gates, the invention is not so limited, and may be embodied by any applicable type of logic gates in any desired combination, such as NOT gates, flip-flops, memory elements, decoders, etc.

The fabrication of an FET logic gate structure embodying the present invention may be performed using conventional methods such as described in a textbook entitled "ANALYSIS AND DESIGN OF DIGITAL INTEGRATED CIRCUITS", by D. Hodges et al, Mc-Graw Hill, 1983, pp. 12–63, except for the conversion of the logic function of the structure by altering selected FETs to be constantly turned ON or OFF. The method of doping the FET channel regions using ion implantation to permanently alter the threshold voltages and thereby the logic states thereof is illustrated in FIGS. 3 and 4.

An enhancement mode FET 30 is formed in a substrate 32 by conventional ion implantation or diffusion, and includes a source 34, drain 36, and a channel region 38 defined in the substrate 32 between the source 34 and drain 36. A photoresist mask 40 is formed over the substrate 32 except over the channel region 38 of the FET 30 which is to be altered. Although only one FET 30 is illustrated in the drawing, an actual logic gate structure embodying the present invention will include a plurality of FETs formed in the substrate 32 in an arrangement as exemplified by FIGS. 1 and 2.

The substrate 30 is irradiated with an ion beam of the desired ion species as illustrated by arrows 42. The mask 40 prevents the ions from affecting the underlying areas of the substrate 30 (source 34, drain 36, etc.). However, the ions are implanted into the substrate 32 in the uncovered channel region 38 to change the doping concentration therein.

Figure 3:
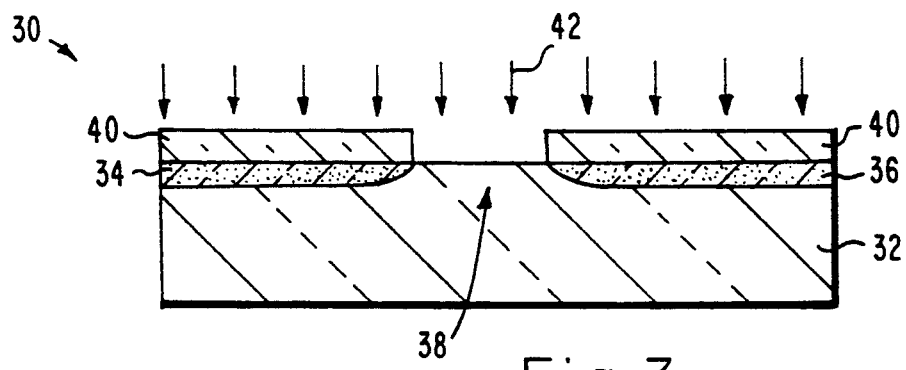
FIGS. 3 and 4 are simplified sectional views illustrating a method of fabricating the logic gate structures illustrated in FIGS. 1 and 2.
Figure 4:
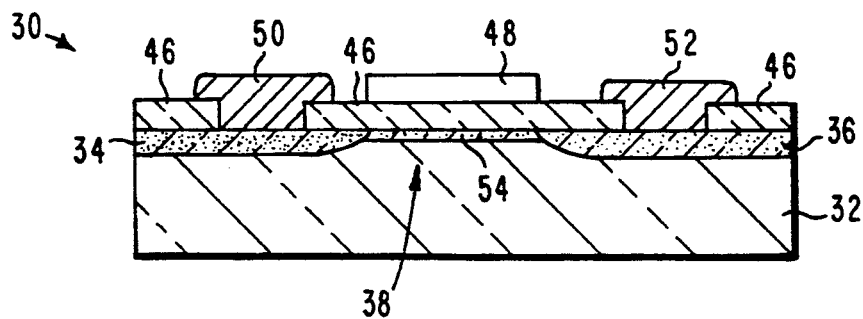

After the ion implantation step of FIG. 3, the mask 40 is removed and fabrication of the FET 30 is continued in a conventional manner as illustrated in FIG. 4. A gate oxide layer 46 of, for example, silicon dioxide is formed on the substrate 32, with openings through the layer 46 over the source 34 and drain 36. A polysilicon gate electrode 48 is formed on the oxide layer 46 over the channel region 38. Source and drain metal contacts 50 and 52 are formed on the exposed areas of the substrate 32 in ohmic contact with the source 34 and drain 36 respectively. Although not shown in the drawing, a gate metal contact is formed on the substrate 32 in ohmic contact with the gate electrode 48. The ion implanted region of the channel 38 is designated as 54.

The substrate 32 may be formed of silicon, with the FET 30 being an NMOS or PMOS device. Alternatively, the substrate 32 may be formed of gallium arsenide or other semi-insulating material, with the FET 30 being a MESFET device for use in a DCFL configuration.

Where the FET 30 is an enhancement mode NMOS device, the substrate 32 will be formed of silicon doped with an acceptor or P-type impurity such as boron to a concentration of typically $5 \times 10^{14}$ atoms/cm$^3$. The FET 30 may be altered so as to be constantly turned ON by reducing the acceptor doping concentration and thereby decreasing the threshold voltage through ion implantation with a donor or N-type ion species, preferably arsenic, at a concentration of at least approximately $2 \times 10^{16}$ ions/cm$^3$. The FET may be altered so as to be constantly turned OFF by increasing the acceptor concentration and thereby increasing the threshold voltage through ion implantation with an acceptor or P-type ion species, preferably boron, at a concentration of at least approximately $1.2 \times 10^{17}$ ions/cm$^3$.

Where the FET 30 is an enhancement mode PMOS device, the substrate 32 will be formed of silicon doped with a donor or N-type impurity such as arsenic or phosphorous to a concentration of typically $5 \times 10^{14}$ atoms/cm$^3$. The FET 30 may be altered so as to be constantly turned ON by reducing the donor doping concentration and thereby increasing the threshold voltage through ion implantation with an acceptor or P-type ion species, preferably boron, at a concentration of at least approximately $2 \times 10^{16}$ ions/cm$^3$. The FET may be altered so as to be constantly turned OFF by increasing the donor concentration and thereby decreasing the threshold voltage through ion implantation with a donor or N-type ion species, preferably arsenic, at a concentration of at least approximately $1.2 \times 10^{17}$ ions/cm$^3$.

As a CMOS device includes a combination of NMOS and PMOS FETs, the individual NMOS and PMOS FETs may be altered using the ion implantation levels described above. It will be noted that an implant which turns an NMOS FET ON will turn a PMOS FET OFF, and vice-versa. Thus, both types of FETs may be altered in a unitary implantation step in the CMOS configuration.

Where the FET 30 is an enhancement mode, n-channel MESFET device for operation in the DCFL configuration, the substrate 32 will be formed of gallium arsenide, with the channel region 38 lightly doped with silicon to a donor or N-type concentration of typically $2 \times 10^{17}$ atoms/cm$^3$. The FET 30 may be altered so as to be constantly turned ON by increasing the donor doping concentration and thereby decreasing the threshold voltage through ion implantation with a donor or N- type ion species, preferably silicon, at a concentration of at least approximately $2 \times 10^{17}$ ions/cm$^3$. The FET may be altered so as to be constantly turned OFF by reducing the donor concentration and thereby increasing the threshold voltage through ion implantation with an acceptor or P-type ion species, preferably zinc, at a concentration of at least approximately $5 \times 10^{17}$ ions/cm$^3$.

Although the preferred method of altering the doping concentrations of the channel regions in the FETs has been described and illustrated as including masking and implanting ions into the unmasked areas, the invention is not so limited. The FET channel regions may alternatively be altered using a focussed ion beam, selective diffusion, or any other method which is capable of producing the desired results.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A logic gate structure comprising:
   a substrate; and
   a plurality of field effect transistors (FETs) formed on the substrate, each FET having a gate electrode and a channel region, the FETs being arranged such that said structure will perform a selected one of a plurality of logic functions;
   a first logic function of said plurality of logic functions, wherein the plurality of FETs are connected in series and the channel region of a FET of the plurality of FETs is doped to cause the structure to have a first logic state which varies in accordance with a logical value of applied gate voltage;
   a second logic function of said plurality of logic functions, wherein the plurality of FETs is further arranged into a parallel connected portion which is connected in series to the series connected portion and the channel regions of the series connected FETs are doped to cause the structure to have a second logic state which varies in accordance with the logical values of applied gate voltage;
   a third logic function of said plurality of logic functions, wherein the plurality of FETs is further arranged into the series and the parallel connected portions and the channel region of a series connected FET is doped to cause the structure to have a constant third logic state for all logical values of applied gate voltage; and
   a fourth logic function of said plurality of logic functions, wherein the plurality of FETs is further arranged into the series and the parallel connected portions and the channel regions of all of the series connected FETs and a parallel connected FET of the plurality of FETs are doped to cause the structure to have a constant fourth logic state for all logical values of applied gate voltage.

2. A structure as in claim 1, in which the plurality of FETs is arranged such that one of the first and second logic functions is NAND, and the other of the first and second logic functions is NOR.

3. A structure as in claim 1, in which:
   the substrate comprises silicon; and
   said series connected FETs are formed on the substrate as an enhancement mode n-channel metal oxide semiconductor (NMOS) FETs such that doping the channel regions thereof with arsenic to a concentration of at least approximately $2 \times 10^{16}$ ions/cm$^3$ causes said series connected FETs to be constantly turned ON for said second and said fourth logic functions.

4. A structure as in claim 1, in which:
   the substrate comprises silicon; and
   at least one of the FETs is formed on the substrate as an enhancement mode n-channel metal oxide semiconductor (NMOS) FET such that doping the channel region thereof with boron to a concentration of at least approximately $1.2 \times 10^{17}$ ions/cm$^3$ causes said at least one of the FETs to be constantly turned OFF for said first and said third logic functions.

5. A structure as in claim 1, in which:
   the substrate comprises silicon; and
   said series connected FETs are formed on the substrate as an enhancement mode p-channel metal oxide semiconductor (PMOS) FETs such that doping the channel regions thereof with boron to a concentration of at least approximately $2 \times 10^{16}$ ions/cm$^3$ causes said series connected FETs to be constantly turned ON for said second and said fourth logic functions.

6. A structure as in claim 1, in which:
   the substrate comprises silicon; and
   at least one of the FETs is formed on the substrate as an enhancement mode p-channel metal oxide semiconductor (PMOS) FET such that doping the channel region thereof with arsenic to a concentration of at least approximately $1.2 \times 10^{17}$ ions/cm$^3$ causes said at least one of the FETs to be constantly turned OFF for said first and said third logic functions.

7. A structure as in claim 1, in which:
   the substrate comprises gallium arsenide; and
   said series connected FETs are formed on the substrate as an enhancement mode n-channel metal oxide semiconductor (MESFET) FET such that doping the channel regions thereof with silicon to a concentration of at least approximately $2 \times 10^{17}$ ions/cm$^3$ causes said series connected FETs to be constantly turned ON for said second and said fourth logic functions.

8. A structure as in claim 1, in which:
   the substrate comprises gallium arsenide; and
   at least one of the FETs is formed on the substrate as an enhancement mode, metal semiconductor (MESFET) FET such that doping the channel region thereof with zinc to a concentration of at least approximately $5 \times 10^{17}$ ions/cm$^3$ causes said at least one of the FETs to be constantly turned OFF for said first and said third logic functions.

9. A structure as in claim 1, in which:
   the plurality of FETs include:
   a plurality of first FETs connected in parallel circuit with each other; and
   a plurality of second FETs connected in series circuit with each other and with said parallel connection of first FETs;
   the first logic function is NAND;

doping the plurality of second FETs so as to be constantly turned ON converts said structure to perform a NOR second logic function;

doping a second FET so as to be constantly turned OFF converts said structure to produce said third logical function having the logically high third logic state for all combinations of applied logical inputs; and doping the plurality of the first FETs and a FET of the plurality of the second FETs so as to be constantly turned ON converts said structure to produce said fourth logical function having said fourth logical state which is low for all combinations of applied logical inputs.

10. A method of fabricating a logic gate structure on a substrate which normally performs a first logic function and is convertible during said fabrication to perform a selected one of a second, third and fourth logic functions, comprising the steps of:

(a) partially forming each field effect transistor (FET) of a plurality FETs on the substrate, each partially formed FET having a source, drain and channel region, the plurality of FETs being arranged into series and parallel connected portions;

(b) doping the channel region of all of the series connected FETs to cause the structure to produce a second logic state which varies for all logical values of applied gate voltage and to convert said structure from performing the first logic function to performing the second logic function;

(c) doping the channel region of a series connected FET of the plurality of FETs to cause the structure to produce a constant third logic state for all values of applied gate voltage and to convert said structure from performing the first logic function to performing the third logic function;

(d) doping the channel region of all of the series connected FETs and a parallel connected FET of the plurality of FETs to cause the structure to produce a constant fourth logic state for all values of applied gate voltage and to convert said structure from performing the first logic function to performing the fourth logic function; and (e) completing fabrication of the plurality of FETs including forming gate electrodes over the channel regions thereof respectively, wherein in the steps of doping, the channel region of the respective FETs are implanted with sufficient ions of a predetermined ion species to change the doping level thereof.

11. A method as in claim 10, in which:
the substrate includes silicon;
step (a) comprises partially forming said each FET on the substrate as an enhancement mode n-channel metal oxide semiconductor (NMOS) FET; and
the steps of doping comprise implanting the channel region of the respective FETs with arsenic ions to a concentration of at least approximately $2 \times 10^{16}$ ions/cm$^3$ to cause the respective FETs to be constantly turned ON.

12. A method as in claim 10, in which:
the substrate includes silicon;
step (a) comprises partially forming said each FET on the substrate as an enhancement mode n-channel metal oxide semiconductor (NMOS) FET; and
the steps of doping comprise implanting the channel region of the respective FETs with boron ions to a concentration of at least approximately $1.2 \times 10^{17}$ ions/cm$^3$ to cause the respective FETs to be constantly turned OFF.

13. A method as in claim 10, in which:
the substrate includes silicon;
step (a) comprises partially forming said each FET on the substrate as an enhancement mode n-channel metal oxide semiconductor (NMOS) FET; and
the steps of doping comprise implanting the channel region of the respective FETs with boron ions to a concentration of at least approximately $2 \times 10^{16}$ ions/cm$^3$ to cause the respective FETs to be constantly turned ON.

14. A method as in claim 10, in which:
the substrate includes silicon;
step (a) comprises partially forming said each FET on the substrate as an enhancement mode n-channel metal oxide semiconductor (NMOS) FET; and
the steps of doping comprise implanting the channel region of the respective FETs with arsenic ions to a concentration of at least approximately $1.2 \times 10^{17}$ ions/cm$^3$ to cause the respective FETs to be constantly turned OFF.

15. A method as in claim 10, in which:
the substrate includes gallium arsenide;
step (a) comprises partially forming said each FET on the substrate as an enhancement mode, metal semiconductor (MESFET) FET; and
the steps of doping comprise implanting the channel region of the respective FETs with silicon ions to a concentration of at least approximately $2 \times 10^{17}$ ions/cm$^3$ to cause the respective FETs to be constantly turned ON.

16. A method as in claim 10, in which:
the substrate includes gallium arsenide;
step (a) comprises partially forming said each FET on the substrate as an enhancement mode, metal semiconductor (MESFET) FET; and
the steps of doping comprise implanting the channel region of the respective FETs with zinc ions to a concentration of at least approximately $5 \times 10^{17}$ ions/cm$^3$ to cause the respective FETs to be constantly turned OFF.

17. A method as in claim 10, in which the steps of doping comprises the substeps of:
(d) masking the substrate in areas except for the channel region of said at least one of the partially formed FETs; and
(e) irradiating the substrate with an ion beam of said predetermined ion species.

* * * * *